(12) United States Patent
Perry et al.

(10) Patent No.: US 12,438,690 B1
(45) Date of Patent: Oct. 7, 2025

(54) DELAY LOCKED LOOPS

(71) Applicant: Cirrus Logic International Semiconductor Ltd., Edinburgh (GB)

(72) Inventors: Ivan Perry, Penicuik (GB); Christopher P. Mortimore, Penicuik (GB); Morgan T. Prior, Dunbar (GB); Ishita Samanta, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 18/627,928

(22) Filed: Apr. 5, 2024

(51) Int. Cl.
*H04L 7/00* (2006.01)
(52) U.S. Cl.
CPC .................................. *H04L 7/0033* (2013.01)
(58) Field of Classification Search
CPC .................. H04L 7/0033; H04L 7/00
See application file for complete search history.

(56) References Cited

U.S. PATENT DOCUMENTS

| | | | | |
|---|---|---|---|---|
| 6,518,807 B1* | 2/2003 | Cho | ........................ | H03L 7/087 327/158 |
| 9,306,585 B1* | 4/2016 | Elkholy | ................ | H03L 7/0814 |
| 2002/0027967 A1* | 3/2002 | Chung | ................... | H03L 7/089 375/376 |
| 2002/0153929 A1* | 10/2002 | Yoo | ........................ | H03L 7/0818 327/158 |
| 2008/0150598 A1* | 6/2008 | Lee | ........................ | H03L 7/113 327/158 |
| 2022/0239255 A1 | 7/2022 | Pamarti et al. | | |

OTHER PUBLICATIONS

Combined Search and Examination Report under Sections 17 and 18(3), UKIPO, Application No. GB2502063.7, mailed Jul. 24, 2025.

\* cited by examiner

*Primary Examiner* — Jaison Joseph
(74) *Attorney, Agent, or Firm* — Jackson Walker L.L.P.

(57) ABSTRACT

This application relates to methods and apparatus for delay locked loops (DLLs). A DLL circuit includes a variable delay line, a phase detector and a delay controller. The DLL circuit is operable in a DLL mode in which a reference clock signal is input to the variable delay line and the delay controller controls a delay setting to achieve phase lock between the reference signal and an output signal. The DLL circuit is also operable in a frequency-locked-loop (FLL) mode, in which part of variable delay line is configured as a controlled oscillator to provide an oscillator signal, a frequency monitor determines a frequency relationship between the reference clock signal and the oscillator signal and the delay controller controls the delay setting to achieve frequency lock. The DLL circuit may configured to operate in the frequency-locked-loop mode on start-up and then transition to the DLL mode.

21 Claims, 1 Drawing Sheet

DELAY LOCKED LOOPS

FIELD OF DISCLOSURE

The field of representative embodiments of this disclosure relates to methods, apparatus and/or implementations concerning or relating to delay locked loops, and, in particular, to start-up of delay locked loops.

BACKGROUND

Delay locked loops (DLLs) are used in a variety of different applications to provide clock or timing control functionality, for instance multiphase clock generation, via relatively simple circuitry. FIG. 1 illustrates one example of a known DLL 100. The DLL 100 comprises a variable delay line 101, formed from a plurality of identical delay elements 102 connected in series, that can be tuned to provide a controlled delay. A reference clock signal CLK_REF is supplied to an input of the delay line 101 and a phase detector 103 is configured to receive both the reference clock signal CLK_REF and an output clock signal CLK_OUT output from the delay line 101, and provide a phase detector output that indicates whether a clock edge of the output clock signal CLK_OUT leads or lags a corresponding clock edge of the reference clock signal CLK_REF. A delay controller 104 is responsive to the phase detector 103 and increases or decreases the delay of the variable delay line 101 to achieve phase lock between the reference clock signal CLK_REF and the output clock signal CLK_OUT. In the example of FIG. 1, the delay controller 104 comprises a filter 105, such as an integrator or PI filter, for filtering the output of the phase detector 103 and an IDAC (current output digital to analog converter) 106 for controlling a bias current which sets the delay of the delay elements 102, but it will be understood that other delay control arrangements may be implemented.

In this way, the overall delay of the variable delay line 101 is controlled to be become equal to a desired delay value based on a period of the reference clock signal CLK_REF, and for at least some applications, the desired delay for the variable delay line may be equal to one clock period of the reference clock signal CLK_REF. One or more tap points are arranged at different positions along the variable delay line 101 so as to provide different tap signals Tap1 to TapN, which are delayed with respect to one another by intervals which are a fraction of the overall delay, and which may thus be fractions of the clock period of the reference clock signal CLK_REF. Such tap signals can be used as multiphase clock signals for timing control with a greater time resolution or granularity than would be achievable using the reference clock signal CLK_REF alone, or could, if desired be combined by an edge combiner or similar to provide a synthesized clock signal at N times the frequency of the reference clock signal CLK_REF.

Purely by way of example, consider that the reference clock signal CLK_REF has a frequency of 1 MHz say. Using the reference clock signal CLK_REF only, the minimum time resolution for triggering different evets may be equal to the duration of a single clock period, i.e. 1 µs. However, if a DLL 100 such as illustrated in FIG. 10 were implemented with a variable delay line 101 comprising ten delay elements 102, each with a respective tap point, and the variable delay line was controlled to an overall delay equal to one clock period of the reference clock signal, the relative delay between successive tap signals would be equal to 0.1 µs and the different tap signals could be used to trigger different evets with a time resolution of 0.1 µs.

In some cases, however, DLLs can suffer from the issue of sub-harmonic locking, sometimes referred to as false locking, where the control loop of the DLL locks to an incorrect delay value for the variable delay line. The control loop of the DLL 100 discussed with reference to FIG. 1 acts to ensure that clock edges of the output clock signal CLK_OUT are aligned with corresponding clock edges of the reference clock signal, but, as the phase detector 103 of the control loop of the DLL 100 only acts to provide phase locking, there could be the possibility of a phase error of 360° or multiples thereof. If the desired overall delay for the variable delay line is equal to one clock period of the reference clock signal CLK_REF, then when the variable delay line has the correct delay, a rising edge of the output clock signal CLK_OUT which is delayed by one clock period with be aligned with the next rising edge of the reference clock signal and the phase detector will maintain phase lock. However, a rising edge of the output clock signal CLK_OUT would also be aligned with a rising edge of the reference clock signal CLK_REF if the overall delay was equal to two clock periods (or any integer number of clock periods) of the reference clock signal. If, on start-up, the initial delay of the variable delay line 101 was closer to two clock periods than to one clock period, the control loop may incorrectly lock to the wrong delay value, which would mean that the relative delays between the different tap signals would be incorrect.

In some cases, to try avoid sub-harmonic locking, the variable delay line may be controlled on start-up to provide its minimum possible delay, with the aim that the delay is increased by the control loop until phase lock is achieved. However, this approach may not provide optimal start-up and can lead to problems such as stuck states, e.g. where the control loop tries to reduce the delay further (essentially to zero).

In some implementations, a DLL may instead be configured so that the delay range of the variable delay line is somewhat narrowly constrained around desired delay, to try to avoid the issue of sub-harmonic locking. For example the variability of the delay line may be constrained so that, even in the worst case expected operating conditions the maximum delay of the variable delay line is still closer to one clock period of the reference clock signal than to two clock periods. On start-up it would then be expected that the control loop will phase lock to the correct delay. This does, however, require the clock period of the reference clock to be known and to be non-variable in use.

In some cases it may be desirable for the reference clock frequency to be selectably variable from a range of possible frequencies, which would result in a range of possible clock periods, but there still be a desire to provide multiphase clock signals from the reference clock signal at the selected frequency.

In such applications, a phase-locked-loop (PLL) may be used instead of a DLL to synthesize a clock signal at a desired multiple of the reference clock signal, however PLLs require the use of phase-and-frequency detectors as part of the control loop and are generally more complex to implement than DLLs.

SUMMARY

Embodiments of the present disclosure relate to methods and apparatus for delay-locked loops that at least mitigate at least some of above-mentioned issues.

According to an aspect of the disclosure there is provided a locked-loop circuit comprising a variable delay line comprising a plurality of delay elements, a phase detector configured to determine any phase difference between a reference clock signal and an output clock signal output from the variable delay line; and a delay controller configured to control at least one delay setting to control a delay of the variable delay line. The locked-loop circuit is operable in a delay-locked-loop mode in which the reference clock signal is input to the variable delay line and the delay controller is configured to control the delay setting based on an output of the phase detector to achieve phase lock between the reference signal and the output signal. The locked loop circuit is also operable in a frequency-locked-loop mode in which at least part of variable delay line is configured to be operated as a controlled oscillator to provide an oscillator signal, a frequency monitor is configured to determine a frequency relationship between the reference clock signal and the oscillator signal and the delay controller is configured to control said delay setting based on an output of the frequency monitor so as achieve a predetermined frequency relationship between the reference clock signal and the oscillator signal which corresponds to the delay of the variable delay line being a desired delay value. The locked-loop circuit is configured to operate in the frequency-locked-loop mode for a first period and then transition to operating in the delay-locked-loop mode, wherein the delay setting at the end of the first period of operation in the frequency-locked-loop mode is used as the delay setting at the start of the operation in the delay-locked-loop mode.

In some implementations, in the frequency-locked-loop mode, the oscillator signal may be tapped from a defined tap point which partway along the variable delay line and the oscillator signal is supplied to an oscillator feedback path for feedback to the input of the variable delay line. The defined tap point may be substantially half-way along the variable delay line. In some implementations, the defined tap point may be selectively configured to be any of a plurality of tap points along the variable delay line. In some implementations, the oscillator feedback path may comprise an inverter.

The frequency monitor may comprise a counter configured to determine a value indicative of any difference in count value between clock edges in the reference clock signal and corresponding clock edges in the oscillator signal.

The delay controller may comprise a current output digital to analog converter configured to output a bias current to the plurality of delay elements and said at least one delay setting comprises an input code for the current output digital to analog converter.

The predetermined frequency relationship between the between the reference clock signal and the oscillator signal may, in some examples, comprise a 1:1 relationship. In some examples, the desired delay value may be equal to one clock period of the reference clock signal.

In some implementations, in the frequency-locked-loop mode, the delay controller may be configured to controllably vary the delay settings to implement a search algorithm and monitor the output of the frequency monitor to determine the delay setting that achieves said predetermined frequency relationship between the reference clock signal and the oscillator signal. In some implementations, in the frequency-locked-loop mode, the delay controller may be configured to controllably vary the delay settings to increase or decrease the delay of the variable delay line based on the output of the frequency monitor filtered by a loop filter.

The locked-loop circuit may comprise a mode controller for controlling the mode of operation of the locked loop circuit. The mode controller may be configured such that said first period has a predetermined duration, or may be configured to monitor the operation of the locked-loop circuit during the first period of operation in the frequency-locked-loop mode and to trigger the end of the first period and the transition to the delay-locked-loop mode when the frequency relationship between the reference clock signal and the oscillator signal has achieved said predetermined frequency relationship. The mode controller may be configured to flush the variable delay line as part of said transition to operating in the delay-locked-loop mode. The mode controller may, in some examples, be operable to selectively operate the locked-loop circuit in the frequency-locked-loop mode without transitioning to operate in the delay-locked-loop mode.

The locked-loop circuit may be implemented as part of an electronic device, wherein, in the delay-locked-loop mode of operation, a plurality of tap signals are tapped from the variable delay line for use as multiphase clock signals by the electronic device.

In another aspect, there is provided a locked-loop circuit comprising: a variable delay line comprising a plurality of delay elements; and a delay controller configured to control at least one delay setting to control a delay of the variable delay line. The locked-loop circuit is operable in a delay-locked-loop mode in which a reference clock signal is input to the variable delay line and the delay controller is configured to control said delay setting to achieve phase lock between the reference signal and the output signal. The locked loop circuit is also operable in a frequency-locked-loop mode in which at least part of variable delay line is configured to be operated as a controlled oscillator to provide an oscillator signal with an oscillation period substantially equal to said delay of the variable delay line and the delay controller is configured to control said delay setting such that said oscillation period matches a clock period of the reference clock signal.

In some implementations, the locked-loop circuit may be configured, on start-up, to operate in the frequency-locked-loop mode for a first period and then transition to operating in the delay-locked-loop mode, wherein the delay setting at the end of the first period of operation in the frequency-locked-loop mode is used as the delay setting at the start of the operation in the delay-locked-loop mode. In the frequency-locked-loop mode, the oscillator signal may be tapped from a defined tap point which is substantially half-way along the variable delay line and the oscillator signal is supplied to an oscillator feedback path for feedback to the input of the variable delay line. In the frequency-locked-loop mode, the delay controller may be configured to control said delay setting responsive to a counter which is configured determine a number of clocks edges of the oscillator signal in a count period defined by the reference clock signal.

In another aspect, there is provided a delay-locked-loop circuit comprising: a variable delay line comprising a plurality of delay elements; and a delay controller configured to control at least one delay setting to control a delay of the variable delay line. The delay-locked-loop circuit is configured, on start-up, to operate at least part of said variable delay line as an oscillator in a frequency-locked-loop to determine a delay setting that achieves a frequency lock between an oscillator signal of the oscillator and a reference clock signal and then to transition to using the variable delay line in a delay-locked-loop using said determined delay setting.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Figure 1:
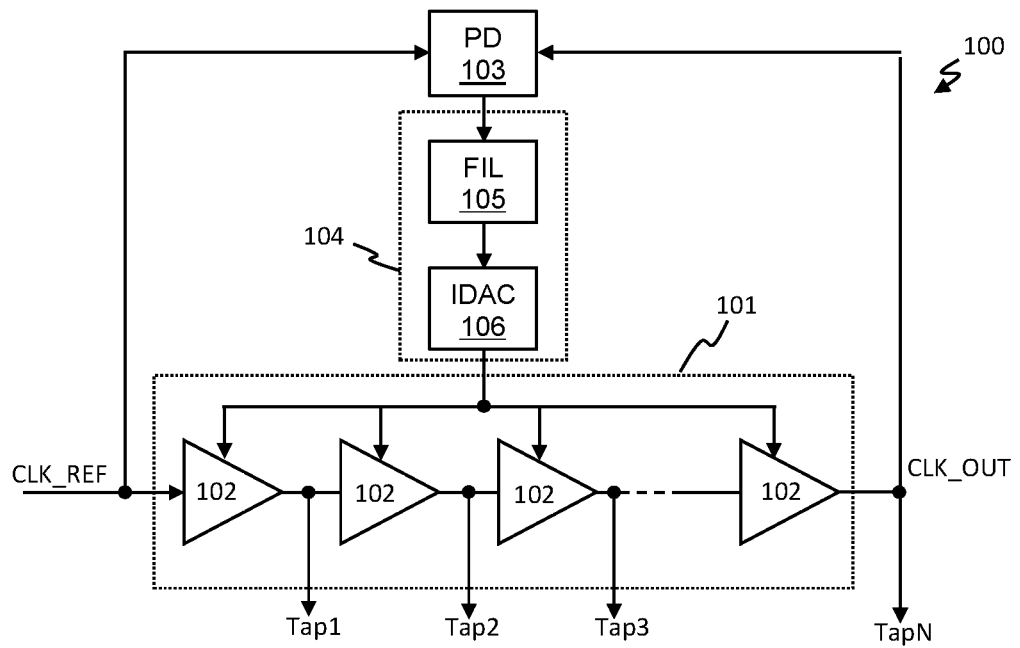
FIG. 1 illustrates one example of a known DLL.
Figure 2:
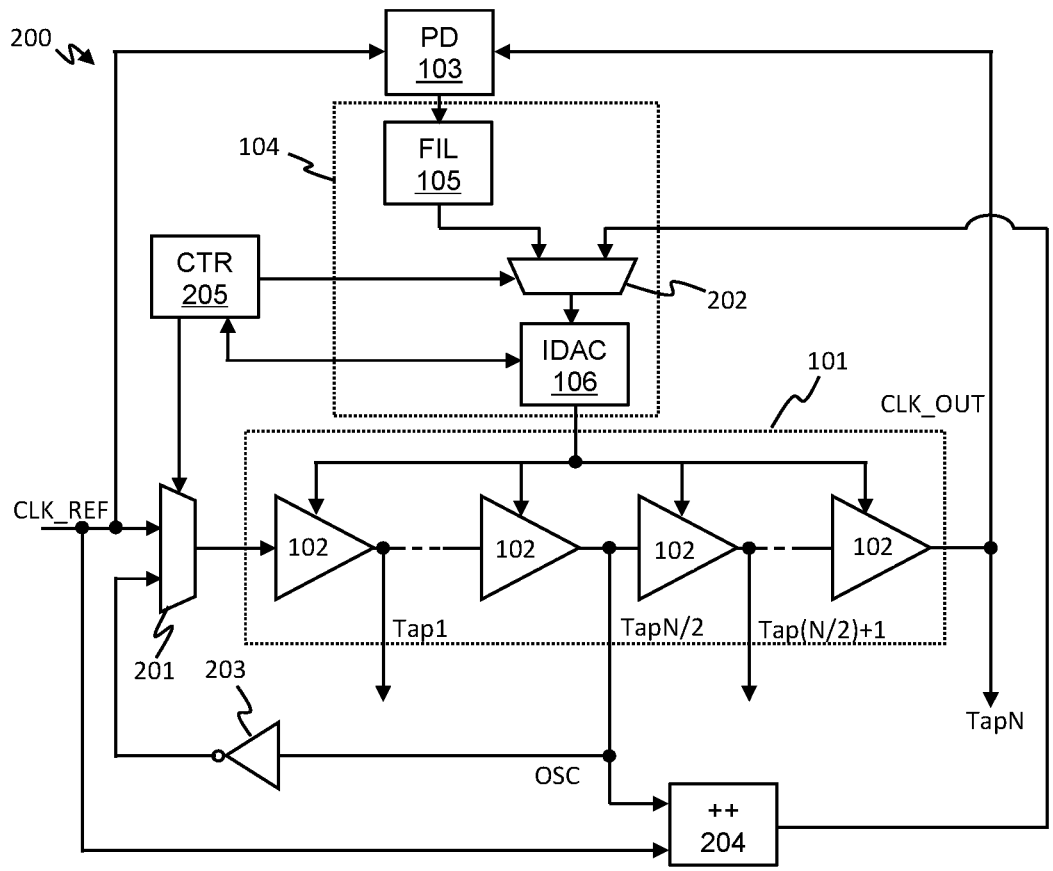
FIG. 2 illustrates an example of a DLL according to an embodiment.

FIG. 2 illustrates an example of a locked-loop circuit 200 according to an embodiment in which similar components to those discussed with reference to FIG. 1 are identified by the same references.

The locked-loop circuit 200 of FIG. 2 comprises a variable delay line 101 comprising a series of substantially identical delay elements 102 in series and a delay controller 104 for controlling the delay of the variable delay lines 101, in this example by varying the strength of a bias current supplied to the delay elements 102 by an IDAC 106 (although it will be understood that other arrangements for varying the delay of the delay elements 102, and hence the overall delay of the variable delay line 101, could be implemented).

The locked-loop circuit 200 of FIG. 2 is operable in two modes of operation. In a first mode of operation, which will be referred to as a DLL mode, the locked-loop circuit 200 operates in substantially the same way as the DLL 100 discussed with reference to FIG. 1. In the DLL mode, the variable delay line 101 is configured to receive a reference clock signal CLK_REF as input, in this case via a first signal selector 201, which may comprise a multiplexer or suitable switch arrangement. Phase detector 103 receives the reference clock signal CLK_REF and the output clock signal CLK_OUT output from the variable delay line 101, and provides a phase detector output that indicates whether a clock edge of the output clock signal CLK_OUT leads or lags a corresponding clock edge of the reference clock signal CLK_REF. In the DLL mode, the delay controller 104 is responsive to the phase detector 103 to increase or decrease the delay of the variable delay line 101 to achieve phase lock between the reference clock signal CLK_REF and the output clock signal CLK_OUT, and in this example filter 105, which may for example comprise an integrator or PI filter or the like, supplies a filtered version of the phase detector output to the IDAC 106 via a second signal selector 202.

The locked-loop circuit 200 of FIG. 2 is also configured to be operable in a second mode of operation, which will be referred to herein as a frequency-locked-loop (FLL) mode.

In the FLL mode, the first signal selector 201 does not supply the reference clock signal CLK_REF to the input of the variable delay line, but instead supplies a signal which is tapped from a defined tap point which is part of the way along the variable delay line, and which is inverted by inverter 203.

As will be understood by one skilled in the art, this feedback arrangement means that the signal at the input to the variable delay line 101 will change state, i.e. transition from high to low or vice versa, at regular intervals that depend on the delay between the input of the variable delay line 101 and the defined tap point (and also the propagation delay of the inverter 203). In other words, this operation effectively results in the part of the variable delay line between the input and the defined tap point acting as a controlled oscillator, to provide an oscillator output signal OSC at the defined tap point. In the example of FIG. 2, where the delay of the variable delay line 101 is controlled by the bias current supplied by IDAC 106, at least part of the variable delay line 101 is thus configured, together with an oscillator feedback path comprising the inverter 203, as a simple ICO (current controlled oscillator), although again it will be noted that other arrangements for controlling the delay of variable delay line 101 may be implemented.

In at least some applications, the defined tap point may be a tap point halfway along the variable delay line 101; that is if the variable delay line comprises an even number of N delay elements 102, the defined tap point may be a tap point from delay element N/2 along the variable delay line, i.e. tap signal TapN/2 may provide the oscillator output signal OSC. The TapN/2 signal at this tap point will be high for a period equal to the delay for that half of the variable delay line (plus the delay of inverter 203) and then be low for an equivalent period. The oscillator output signal OSC from this defined tap point is thus effectively a clock signal with a 50/50 duty cycle and a cycle period which is substantially equal to the delay of the whole of the variable delay line 101.

In the FLL mode, this oscillator output signal OSC is supplied to a counter 204, which also receives the reference clock signal. The counter 204 determines a count value indicative of any difference in the number of corresponding clock edges in the oscillator output signal OSC and the reference clock signal CLK_REF, for instance by counting the number of relevant clock edges of the oscillator output signal OSC in a period defined by the reference clock signal CLK_REF. The counter 204 thus acts as a frequency monitor for determining whether the oscillator output signal OSC has a desired frequency relationship to the reference clock signal CLK_REF, which in this example is that the frequencies are the same.

In the FLL mode, the delay controller 104 is responsive to the counter 204 to adjust the delay time of the variable delay line 101 to minimise the difference in the number of clock edges, for instance by using feedback from the counter, possibly via a suitable loop filter (not illustrated) or by implementing some suitable search algorithm, such as a binary search or successive approximation technique. This causes the delay controller 104 to control the delay of the variable delay line 101 in such a way to adjust the frequency of the oscillator output signal to match the frequency of the reference clock signal CLK_REF, which will be the case when the total delay of the variable delay line is substantially equal to the one clock period of the reference clock signal CLK_REF.

Operation of the locked-loop circuit 200 in the FLL mode may advantageously be used on start-up of the circuit, before transition to the DLL mode of operation, to avoid the issue of sub-harmonic locking. Note, as used herein the term start-up shall cover initialisation or power up of the locked-loop-circuitry before use, but in some cases reset or restart of the locked-loop-circuitry can also be considered as start-up and may benefit from operation in the FLL mode.

On start-up, the locked-loop circuit 200 may initially be operated in the FLL mode for a first period. The mode of operation may be controlled by a mode controller 205 which controls the first and second signal selectors 201 and 202 appropriately and which may selectively enable the inverter 203 and/or counter 204.

In the FLL mode, as discussed above, the operation of the locked-loop circuit 200 will adjust the settings of the delay controller 104, in particular the control settings, e.g. input code for the IDAC 106, so that so that frequency of the oscillator output signal becomes close to the frequency of the reference clock signal CLK_REF, and hence the delay of the variable delay line is close to one clock period of the reference clock signal.

At an appropriate point, the mode controller 205 may cause the relevant settings of the delay controller 104 which have been determined in the FLL mode, e.g. the input code for the IDAC 106, to be saved or stored (whether by storing the relevant code in some memory or effectively freezing the state of the IDAC 106) and the locked-loop circuit 200 may transition from the FLL mode to the DLL mode of operation. As part of the transition between modes, first signal selector 201 will be controlled to break the feedback loop and the variable delay line 101 may be flushed, as will be understood by one skilled in the art, to ensure the correct starting conditions for DLL operation. Operation in the DLL mode may then be started, with the first signal selector 201 providing the reference clock signal CLK_REF to the input of the variable delay line 101 and second signal selector 202 being controlled so that the delay controller 104 is responsive to the output of the phase detector 103 so as to achieve phase lock. However, the saved or stored settings for the delay controller 104, e.g. the input code for IDAC 106, that were determined during the FLL mode of operation will be used as the starting settings for operation in the DLL mode. This means that the DLL mode of operation starts with a controlled delay for the variable delay line 101 that has been determined (for the current operating conditions) to be close to the correct desired delay of one clock period of the reference clock signal CLK_REF. The DLL control loop may then operate as normal to achieve phase lock, but as the starting delay is close to the correct delay, the issue of sub-harmonic locking is avoided and the locked-loop circuit should quickly achieve phase lock with the correct delay. In the DLL mode, the counter 204 and/or inverter 203 may be disabled or powered down to save power.

In some implementations, the first period in which the locked-loop circuit 200 is operated in the FLL mode on start-up, before transitioning to the DLL mode, may have a predetermined duration, with the defined predetermined duration being a duration which is determined to provide sufficient time for the FLL to achieve a sufficient frequency lock under the worst case expected operating conditions. However, in some examples the mode controller 205 may be configured to monitor the operation of the locked-loop circuit 200 in the FLL mode and trigger the transition to the DLL mode, and hence the end of the first period of operation in the FLL mode, when the frequency relationship between the reference clock signal and the oscillator signal has achieved the desired frequency relationship. In the present example, where the desired frequency relationship between the oscillation output signal OSC and the reference clock signal CLK_REF is 1:1, i.e. the two frequencies are matched, the desired frequency relationship may be deemed achieved where the delay adjustment in the FLL mode has substantially settled or the FLL frequency is determined to be sufficiently close to the frequency of the reference clock signal CLK_REF, e.g. based on the count value from the counter 204. For the purposes of avoiding sub-harmonic locking in subsequent DLL operation it may be sufficient for the delay of the variable delay line to be within ±40% of the correct delay value, and thus a corresponding frequency match between the oscillator output signal OSC and the reference clock signal CLK_REF may be sufficient.

As noted above, the tap point selected for the oscillator output signal OSC may be half-way along the delay line, e.g. from tap point N/2 for a delay line with an even number of delay elements, as this results in the oscillator output signal OSC having the desired properties of a 50/50 duty cycle and the frequency of the oscillator output signal OSC substantially matching that of the reference clock signal CLK_REF when the delay of the whole variable delay line 101 is equal to one clock period of the reference clock signal.

It would, however, be possible to use some other tap point for tapping the oscillator output signal from the variable delay line 101. Taking the oscillator output signal OSC from halfway along the variable delay line 101 means that the cycle period of the oscillator output signal is defined by the delay to this halfway point, in addition to any delay associated with the inverter 203. The inverter 203 may be controlled to provide a minimal delay, but, if desired, the tap point for the oscillator output signal OSC could be taken from the tap point immediately preceding the half-way point of the variable delay line 101. In some cases, the tap point for the oscillator output signal OSC could be implemented with some offset from the half-way point which is selected so that the oscillator output signal OSC has the desired frequency relationship to the reference clock signal CLK_REF when the variable delay line 101 has the correct delay, e.g. the offset could be arranged to compensate for some delay in the digital domain. In some implementations, the relevant tap point for the oscillator output signal OSC in the FLL mode could be fixed by design, e.g. hardwired, but in some cases the tap point used for the oscillator output signal OSC in the FLL mode could be configured and could, for example, be determined as part of a calibration process.

In some implementations, the tap point for the oscillator output signal OSC may be selected so as provide a frequency relationship between the output oscillator signal OSC and the reference clock signal CLK_REF which is not 1:1 when the variable delay line has the correct delay, in which case the delay controller 104 could be responsive to the counter 204 to control the delay line to provide the relevant desired frequency relationship. For instance, if the tap point for the oscillator output signal OSC was only ¼ of the way along the variable delay line 101, e.g. at a tap point N/4, then if the total delay for the variable delay line 101 was equal to the desired delay of one clock period of the reference clock signal CLK_REF, the frequency of the oscillator output signal OSC would be double that of the reference clock signal CLK_REF. In this case, the counter 204 and delay controller 104 could be configured so as to control the delay of the variable delay line 101 such that there are two clock edges of the oscillator output signal OSC for every corresponding clock edge of the reference clock signal CLK_REF. Such an arrangement may, however, be more complex to implement and thus, in at least some applications, the tap point for the oscillator output signal OSC will be selected so as to ensure that the frequency relationship between the frequency relationship between the output oscillator signal OSC and the reference clock signal CLK_REF is substantially 1:1 when the variable delay line has the correct desired delay.

It will be understood that the delay elements 102 have been described as producing a delayed version of the input to that delay element 102 and thus when the input of any delay element 102 goes from low to high, the output of that delay element will go from low to high after the relevant element delay, and vice versa. The invertor 203 is thus used in the FLL mode to provide an inverted version of the oscillator output signal OSC to the input of the variable delay line 101 to ensure the oscillator behaviour. In some implementations, as will be understood by one skilled in the art, each of the delay elements 102 may be implemented by an even number of inverters in series, e.g. each delay element 102 may comprise two series connected inverters. In such implementations, the tap point for the oscillator output signal OSC could be tapped from an intermediate node of one of the delay elements so as to provide an oscillator output signal OSC which is delayed and inverted with respect to the input to the variable delay line. Tapping such a signal as the oscillator output signal OSC would thus avoid the need for the inverter 203 in the oscillator feedback path. Such an arrangement would mean that the oscillator output signal OSC supplied to the counter 204 was the delayed and inverted version, but this wouldn't impact the operation of the counter 204. It will be noted that each of the N delay elements comprising two inverters in series can be seen as being equivalent to the variable delay line comprising 2N delay elements, where each delay element comprises a single inverter and the delay line is tapped from the even numbered delay elements to provide multiphase clock signals, and the oscillator output signal OSC can be tapped from an odd numbered delay element in the FLL mode.

The examples above have been described in the context of setting a delay for the variable delay line 101 which is equal to one clock period of the reference clock signal CLK_REF. If desired, the same principles could be applied to setting the delay of the variable delay line to some other integer number of reference clock periods.

The locked-loop circuit 200 may thus be operated in an FLL mode as part of a start-up process for subsequent operation in a DLL mode. The FLL mode can be implemented by using at least part of the variable delay line of the locked-loop circuit as part of a controlled oscillator, which avoids the need for a separate oscillator for FLL operation. In the FLL mode, a frequency monitor arrangement controls the delay of the variable delay line to provide frequency matching. The frequency monitor can be implemented by using a relatively simple counter arrangement. Once sufficient frequency matching has been achieved, the locked-loop circuit can transition to a DLL mode of operation with the variable delay line (after flushing) being re-used as the variable delay line for the reference clock signal for the DLL and the delay being controlled based on the setting(s) determined in the FLL mode. This circuitry allows for a relatively simple analog design and provides a DLL that can cope with a wide range of possible delay values, but which avoids problems with sub-harmonic locking.

In some implementations, however, the locked-loop circuit may be selectively operable in the FLL mode to provide ongoing FLL functionality, i.e. not just as part of a start-up process for a DLL.

Embodiments may be implemented as an integrated circuit. Embodiments may be implemented in a host device, which may be a portable and/or battery powered host device such as a mobile computing device for example a laptop, notebook or tablet computer, or a mobile communication device such as a mobile telephone, for example a smartphone, or an image capture device, such as a scanner. The device could be a wearable device such as a smartwatch. The host device could be a games console, a remote-control device, a home automation controller or a domestic appliance, a toy, a machine such as a robot, an audio player, a video player. It will be understood that embodiments may be implemented as part of a system provided in a home appliance or in a vehicle. There is further provided a host device incorporating the above-described embodiments.

The skilled person will recognise that some aspects of the above-described apparatus and methods, for instance processing of the various signals, may be embodied as processor control code, for example on a non-volatile carrier medium such as a disk, CD- or DVD-ROM, programmed memory such as read only memory (Firmware), or on a data carrier such as an optical or electrical signal carrier. For some applications, embodiments may be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A locked-loop circuit comprising:
   a variable delay line comprising a plurality of delay elements;
   a phase detector configured to determine any phase difference between a reference clock signal and an output clock signal output from the variable delay line; and
   a delay controller configured to control at least one delay setting to control a delay of the variable delay line;
   wherein the locked-loop circuit is operable in a delay-locked-loop mode in which said reference clock signal is input to the variable delay line and the delay controller is configured to control said delay setting based on an output of the phase detector to achieve phase lock between the reference signal and the output signal;
   wherein the locked loop circuit is operable in a frequency-locked-loop mode in which at least part of variable delay line is configured to be operated as a controlled oscillator to provide an oscillator signal, a frequency monitor is configured to determine a frequency relationship between the reference clock signal and the oscillator signal and the delay controller is configured to control said delay setting based on an output of the frequency monitor so as achieve a predetermined frequency relationship between the reference clock signal and the oscillator signal which corresponds to the delay of the variable delay line being a desired delay value; and
   wherein the locked-loop circuit is configured to operate in the frequency-locked-loop mode for a first period and then transition to operating in the delay-locked-loop mode, wherein the delay setting at the end of the first period of operation in the frequency-locked-loop mode is used as the delay setting at the start of the operation in the delay-locked-loop mode.

2. The locked-loop circuit of claim 1 wherein, in said frequency-locked-loop mode, the oscillator signal is tapped from a defined tap point which partway along the variable delay line and the oscillator signal is supplied to an oscillator feedback path for feedback to the input of the variable delay line.

3. The locked-loop circuit of claim 2 wherein said defined tap point is substantially half-way along the variable delay line.

4. The locked-loop circuit of claim 2 wherein said defined tap point can be selectively configured to be any of a plurality of tap points along the variable delay line.

5. The locked-loop circuit of claim 2 wherein said oscillator feedback path comprises an inverter.

6. The locked-loop circuit of claim 1 wherein the frequency monitor comprises a counter configured to determine a value indicative of any difference in count value between clock edges in the reference clock signal and corresponding clock edges in the oscillator signal.

7. The locked-loop circuit of claim 1 wherein the delay controller comprises a current output digital to analog converter configured to output a bias current to the plurality of delay elements and said at least one delay setting comprises an input code for the current output digital to analog converter.

8. The locked-loop circuit of claim 1 wherein said predetermined frequency relationship between the between the reference clock signal and the oscillator signal comprise a 1:1 relationship.

9. The locked-loop circuit of claim 1 wherein said desired delay value is equal to one clock period of the reference clock signal.

10. The locked-loop circuit of claim 1 wherein, in the frequency-locked-loop mode, the delay controller is configured to:
    controllably vary the delay settings to implement a search algorithm and monitor the output of the frequency monitor to determine the delay setting that achieves said predetermined frequency relationship between the reference clock signal and the oscillator signal; or
    controllably vary the delay settings to increase or decrease the delay of the variable delay line based on the output of the frequency monitor filtered by a loop filter.

11. The locked-loop circuit of claim 1 comprising a mode controller for controlling the mode of operation of the locked loop circuit.

12. The locked-loop circuit of claim 10 wherein the mode controller is configured such that said first period has a predetermined duration.

13. The locked-loop circuit of claim 10 wherein the mode controller is configured to monitor the operation of the locked-loop circuit during the first period of operation in the frequency-locked-loop mode and to trigger the end of the first period and the transition to the delay-locked-loop mode when the frequency relationship between the reference clock signal and the oscillator signal has achieved said predetermined frequency relationship.

14. The locked-loop circuit of claim 11 wherein the mode controller is configured to flush the variable delay line as part of said transition to operating in the delay-locked-loop mode.

15. The locked-loop circuit of claim 11 wherein the mode controller is operable to selectively operate the locked-loop circuit in the frequency-locked-loop mode without transitioning to operate in the delay-locked-loop mode.

16. An electronic device comprising the locked-loop circuit of claim 1, wherein, in the delay-locked-loop mode of operation, a plurality of tap signals are tapped from the variable delay line for use as multiphase clock signals by the electronic device.

17. A locked-loop circuit comprising:
a variable delay line comprising a plurality of delay elements; and
a delay controller configured to control at least one delay setting to control a delay of the variable delay line;
wherein the locked-loop circuit is operable in a delay-locked-loop mode in which a reference clock signal is input to the variable delay line and the delay controller is configured to control said delay setting to achieve phase lock between the reference signal and the output signal;
wherein the locked loop circuit is operable in a frequency-locked-loop mode in which at least part of variable delay line is configured to be operated as a controlled oscillator to provide an oscillator signal with an oscillation period substantially equal to said delay of the variable delay line and the delay controller is configured to control said delay setting such that said oscillation period matches a clock period of the reference clock signal.

18. The locked-loop circuit of claim 17 wherein, on start-up, the locked-loop circuit is configured to operate in the frequency-locked-loop mode for a first period and then transition to operating in the delay-locked-loop mode, wherein the delay setting at the end of the first period of operation in the frequency-locked-loop mode is used as the delay setting at the start of the operation in the delay-locked-loop mode.

19. The locked-loop circuit of claim 17 wherein, in said frequency-locked-loop mode, the oscillator signal is tapped from a defined tap point which is substantially half-way along the variable delay line and the oscillator signal is supplied to an oscillator feedback path for feedback to the input of the variable delay line.

20. The locked-loop circuit of claim 16 wherein, in the frequency-locked-loop mode, the delay controller is configured to control said delay setting responsive to a counter which is configured determine a number of clocks edges of the oscillator signal in a count period defined by the reference clock signal.

21. A delay-locked-loop circuit comprising:
a variable delay line comprising a plurality of delay elements; and
a delay controller configured to control at least one delay setting to control a delay of the variable delay line;
wherein the delay-locked-loop circuit is configured, on start-up, to operate at least part of said variable delay line as an oscillator in a frequency-locked-loop to determine a delay setting that achieves a frequency lock between an oscillator signal of the oscillator and a reference clock signal and then to transition to using the variable delay line in a delay-locked-loop using said determined delay setting.

* * * * *